United States Patent
Sato et al.

(10) Patent No.: US 8,223,319 B2
(45) Date of Patent: Jul. 17, 2012

(54) EXPOSURE DEVICE

(75) Inventors: Yoshihiko Sato, Gotenba (JP);
Toyoharu Inoue, Gotenba (JP)

(73) Assignee: Ushio Denki Kabushiki Kaisha, Tokyo-to (JP)

(*) Notice: Subject to any disclaimer, the term of this patent is extended or adjusted under 35 U.S.C. 154(b) by 338 days.

(21) Appl. No.: 12/614,666

(22) Filed: Nov. 9, 2009

(65) Prior Publication Data
US 2010/0118290 A1 May 13, 2010

(30) Foreign Application Priority Data
Nov. 10, 2008 (JP) ................... 2008-287414

(51) Int. Cl.
G03B 27/58 (2006.01)
G03B 27/54 (2006.01)
(52) U.S. Cl. ........................... 355/74; 355/67
(58) Field of Classification Search ............ 355/52, 355/53, 55, 67; 356/399–401
See application file for complete search history.

(56) References Cited

U.S. PATENT DOCUMENTS

| | | | |
|---|---|---|---|
| 5,390,025 A | 2/1995 | Morita et al. | |
| 6,924,883 B2 | 8/2005 | Ozaki et al. | |
| 7,057,706 B2 | 6/2006 | Ozaki et al. | |
| 7,463,334 B2 * | 12/2008 | Tokuda | 355/53 |
| 7,701,553 B2 * | 4/2010 | Sasaki | 355/55 |
| 2007/0076197 A1 * | 4/2007 | Koga | 356/237.3 |
| 2009/0103067 A1 * | 4/2009 | Takenaka | 355/53 |

FOREIGN PATENT DOCUMENTS

| | | |
|---|---|---|
| JP | 11-219896 | 8/1999 |
| JP | 2004-272139 | 9/2004 |
| JP | 2005-86093 | 3/2005 |

* cited by examiner

*Primary Examiner* — Hung Henry Nguyen
(74) *Attorney, Agent, or Firm* — Drinker Biddle & Reath LLP

(57) ABSTRACT

An exposure device is provided. The exposure device includes an alignment stage unit, an exposure processing unit and a workpiece moving mechanism. The alignment stage unit includes: an alignment stage that holds a workpiece having workpiece marks thereon; at least one first alignment microscope that detects the workpiece marks of the workpiece; and a first moving mechanism that relatively moves the alignment stage and the first alignment microscope in an 1-axis direction by a width of the workpiece. The exposure processing unit includes: a mask stage that holds a mask having mask marks thereon; a second alignment microscope that detects the mask marks of the mask; and an exposure stage that holds the workpiece. The workpiece moving mechanism moves the workpiece from the alignment stage unit to the exposure processing unit.

4 Claims, 10 Drawing Sheets

EXPOSURE DEVICE

This application claims priority from Japanese Patent Application No. 2008-287414, filed on Nov. 10, 2008, the entire contents of which are hereby incorporated by reference.

BACKGROUND OF THE INVENTION

1. Technical Field

The present disclosure relates to an exposure device that detects a mask alignment mark (mask mark) formed on a mask and a workpiece alignment mark (workpiece mark) formed on a substrate (workpiece), performs alignment so that both marks are in a given positional relationship, and then exposes the workpiece through the mask. More particularly, the present disclosure relates to an exposure device capable of reducing the total time of an exposure process including alignment and exposure.

2. Related Art

In a process of forming a pattern of a semiconductor element, a printed board, and a liquid crystal substrate by photolithography, an exposure device is used. The exposure device aligns a mask having a mask pattern formed thereon and a substrate (hereinafter, also referred to as a workpiece), to which the pattern is transferred, in a given positional relationship, and then the workpiece is irradiated with light, including exposure light, through the mask. Accordingly, the mask pattern is transferred (exposure) to the workpiece.

FIG. 8 and FIG. 9 show that the exposure device divides the workpiece (printed board) into a plurality of exposure areas, and sequentially performs exposure for each of the divided areas while moving the workpiece.

As shown in FIG. 10, the workpiece is divided into four exposure areas A, B, C, and D, and alignment is performed for one exposure area using four workpiece marks (a, b, c, and d for the area A; and b, d, g, and h for the area B).

The mask and the workpiece have to be aligned in two plan directions (X direction and Y direction) and in a rotation direction (θ direction). For this reason, both the mask mark (mask alignment mark) and the workpiece mark (workpiece alignment mark) need to be provided as at least two parts. However, particularly when the workpiece is a printed board, the workpiece may expand and contract lengthwise and breadthwise due to the former process, and recently, four alignment marks are often used to improve alignment precision. In this case, the alignment is performed, for example, so that the sum of deviation in the coordinates of the mask marks and the workpiece marks becomes minimized.

As shown in FIG. 8 and FIG. 9, the exposure device mainly includes a light irradiation unit 1, a mask M, a mask stage MS for holding the mask, a projection lens 2, an exposure stage WS for performing an exposure process on a workpiece W (see FIG. 9) mounted thereon while sequentially moving, an alignment microscope 10 for detecting the mask marks and the workpiece marks, and a control unit 11 for controlling the whole operation of the exposure device.

The light irradiation unit 1 includes a lamp (not shown) for emitting exposure light.

A mask pattern MP that is transferred to the workpiece and mask marks MAM used for alignment to the workpiece are formed on the mask M. The mask stage MS is a stage for holding the mask M.

The projection lens 2 is a lens for projecting the mask pattern MP on the workpiece W.

The exposure stage WS is a stage for holding the workpiece W for an exposure process, and has a vacuum absorption groove (not shown) formed on a surface thereof. In addition, the exposure stage WS is provided with a reflection member MM (mirror) used for detecting a position of the mask mark MAM.

The exposure stage WS is provided with an XYθ moving mechanism (not shown) to align the mask M and the workpiece by moving the workpiece W. The XYθ moving mechanism has a stroke capable of moving the workpiece to each of the divided areas during exposure to move the workpiece in the X direction and the Y direction by a width of the workpiece.

The alignment microscope 10 is a microscope for detecting the mask marks MAM and the workpiece marks, and is provided according to the number of alignment masks (four in this case) detected in one exposure, and only two alignment microscopes are shown in FIG. 8 and FIG. 9. Images of the mask marks MAM or the workpiece marks detected by the alignment microscope 10 are processed in the control unit 11, and positional coordinates thereof are calculated. The alignment microscope 10 is configured to be inserted and withdrawn between the projection lens 2 and the exposure stage WS by an alignment microscope moving mechanism (not shown).

The alignment microscope 10 includes a half mirror 10a, lenses L1 and L2, and a CCD camera 10b. The control unit 11 is provided with a monitor 12 for displaying an image and the like received by the alignment microscope 10.

Next, an exposure sequence will be now described with reference to FIG. 8 and FIG. 9.

(1) As shown in FIG. 8, the mask M is irradiated with exposure light from the light irradiation unit 1, with no workpiece placed on the exposure stage WS.

The mask marks MAM formed on the mask are projected onto the reflection mirror MM of the exposure stage. The reflection mirror MM is provided at a position where the mask mark MAM is projected.

(2) The alignment microscope 10 is inserted between the projection lens 2 and the exposure stage WS. The projection image of the mask mark MAM reflected by the reflection mirror MM is reflected by the half mirror 10a of the alignment microscope 10 and is input to the CCD camera 10b.
The image of the mask mark MAM input to the CCD camera 10b is transmitted to the control unit 11 and is processed, and positional coordinates thereof are calculated and stored.

(3) As shown in FIG. 9, the workpiece W subjected to an exposure process is transported to the exposure stage WS by a transporting mechanism (not shown) and is placed thereon.

(4) The alignment microscope 10 is inserted between the projection lens 2 and the exposure stage WS, and the workpiece marks WAM are detected. Alignment is performed by moving the exposure stage WS so that the detected workpiece marks WAM and the mask marks MAM stored in the process (2) are in a given relationship.

(5) After the alignment is completed, the alignment microscope 10 is withdrawn and exposure light is irradiated from the light irradiation unit 1. The mask pattern MP is projected and transferred onto the workpiece W by the projection lens 2.

(6) After the exposure is completed, the exposure stage WS is moved in the X direction or the Y direction, and then the next exposure area comes under the projection lens 2.

The processes (4) and (5) are repeatedly performed. That is, the alignment microscope 10 is inserted, the workpiece marks WAM are detected, and the alignment is performed, thereby performing the exposure.

In the same manner, the processes (4) to (6) are repeatedly performed. When all the divided areas on the workpiece are exposed, the exposure process of the workpiece is completed. The workpiece is taken out of the exposure device.

Recently, printed boards that are workpieces have become large, and the number of the exposure areas of the workpiece W is increased from the 4 divisions to 16 divisions as shown in FIG. 4. When the number of the divided exposure areas is increased, the exposure processing time for one workpiece is prolonged since the alignment and the exposure are performed in a serial sequence in the exposure method in which the detection and the alignment of the workpiece marks are performed in the exposure stage as described above.

To solve the problem, JP-A-2005-86093 describes the exposure device that includes a first stage for performing an exposure process, and a second stage for performing alignment measurement which is operable independently from the first stage. While the exposure process of the workpiece is performed in the first stage, the positional information of the workpiece on which the next exposure process will be performed is acquired (i.e., detection of workpiece marks) in the second stage.

With such a configuration, the alignment of the next workpiece is performed during the exposure process of another workpiece, and thus it is possible to shorten the time from the start of the exposure process of one workpiece to the end.

When classifying the related-art exposure device shown in FIG. 8 and FIG. 9 into an exposure processing unit including a first stage (hereinafter, referred to as an exposure stage) for performing an exposure process and an alignment stage unit including a second stage (hereinafter, referred to as an alignment stage) for performing alignment measurement, that is, detecting workpiece marks, in the same manner as an exposure device described in JP-A-2005-86093, the alignment stage unit is provided with an alignment stage, a stage moving mechanism for moving the stage in two directions (X and Y directions) perpendicular to each other by a width of the workpiece, and four alignment microscopes.

That is, as shown in FIG. 4, assuming that sixteen exposure areas formed by dividing the workpiece are A, B, C, D, . . . , N, O, and P, while the alignment stage repeats the sequential movement from the exposure area A in the X and Y directions, the alignment marks corresponding to the areas are detected by the alignment microscopes.

As described above, the exposure stage has to be moved in the X and Y directions by the width of the workpiece to expose each of the divided exposure areas. In addition, when the alignment stage is also moved in the X and Y directions by the width of the workpiece, it is necessary to secure a space where the exposure processing unit and the alignment stage unit can be moved in the X and Y directions by the width of the large workpiece. Accordingly, the size of the device becomes significantly large.

When the alignment stage is not moved to prevent this problem, 25 alignment microscopes, corresponding to all the workpiece marks shown in FIG. 4, are necessary. The alignment microscope is a precise optical device and is expensive, and thus the cost of the device being used is increased by using the 25 alignment microscopes.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the disadvantages described above.

According to the present invention, in an exposure device that includes an alignment stage unit and an exposure processing unit to shorten the total time of the exposure process of the alignment and the exposure, the size and cost of the alignment stage can be reduced as small as possible.

According to one or more illustrative aspects of the present invention, there is provided an exposure device. The exposure device comprises:

an alignment stage unit comprising: an alignment stage that holds a workpiece having workpiece marks thereon; at least one first alignment microscope that detects the workpiece marks of the workpiece; and a first moving mechanism that relatively moves the alignment stage and the first alignment microscope in an 1-axis direction by a width of the workpiece;

an exposure processing unit comprising: a mask stage that holds a mask having mask marks thereon; a second alignment microscope that detects the mask marks of the mask; and an exposure stage that holds the workpiece; and a workpiece moving mechanism that moves the workpiece from the alignment stage unit to the exposure processing unit, wherein the workpiece marks and the mask marks are aligned with each other so as to be in a given positional relationship, and then the workpiece is irradiated with exposure light through the mask.

Other aspects of the invention will be apparent from the following description, the drawings and the claims.

DETAILED DESCRIPTION OF EXEMPLARY EMBODIMENTS

Exemplary embodiments of the present invention will be now described with reference to the drawings hereinafter.

Figure 1:
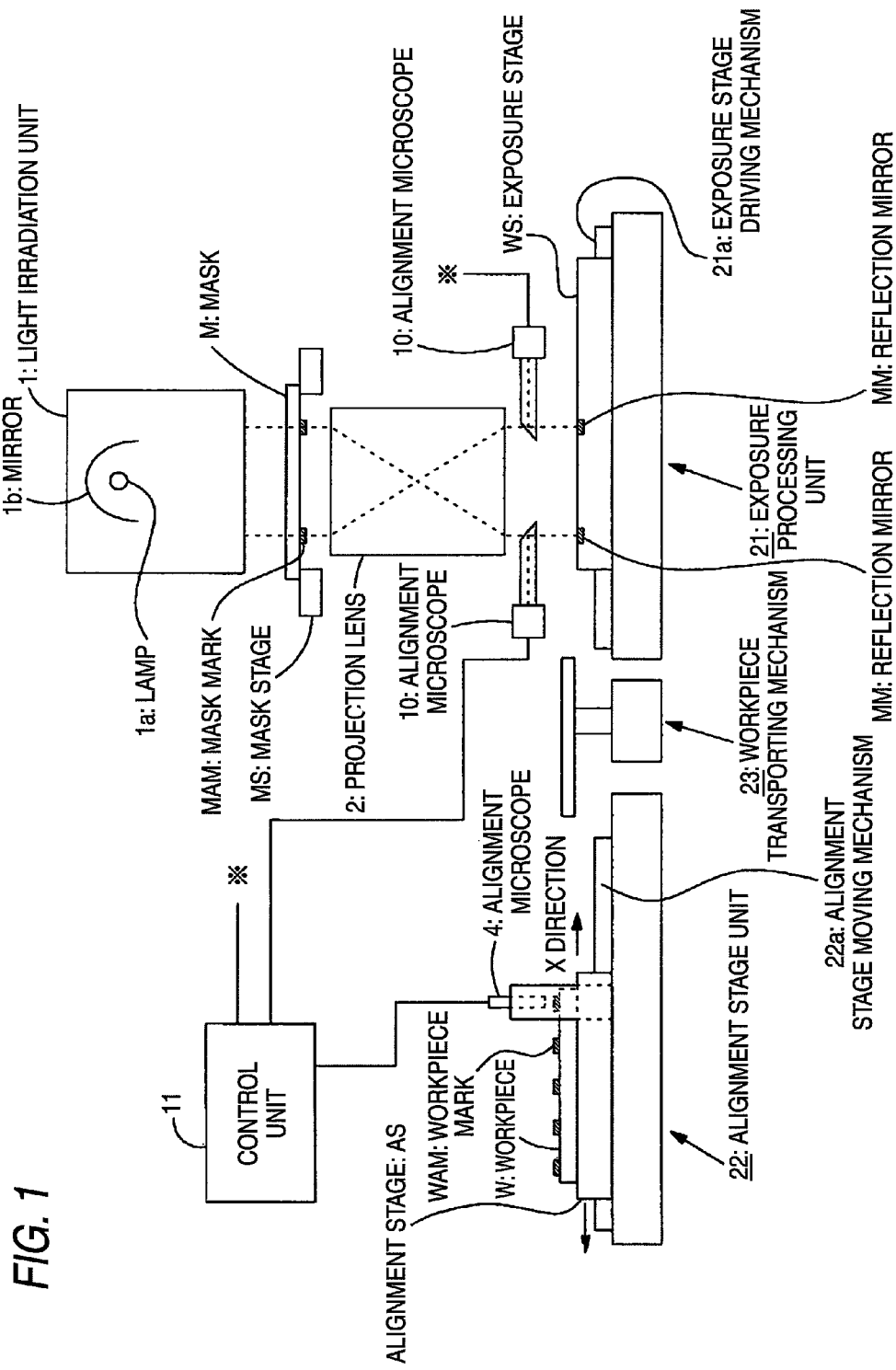
FIG. 1 is a diagram illustrating a configuration of an exposure device according to an exemplary embodiment of the invention.

FIG. 1 is a diagram illustrating an exposure device according to an exemplary embodiment of the invention.

Figure 8:
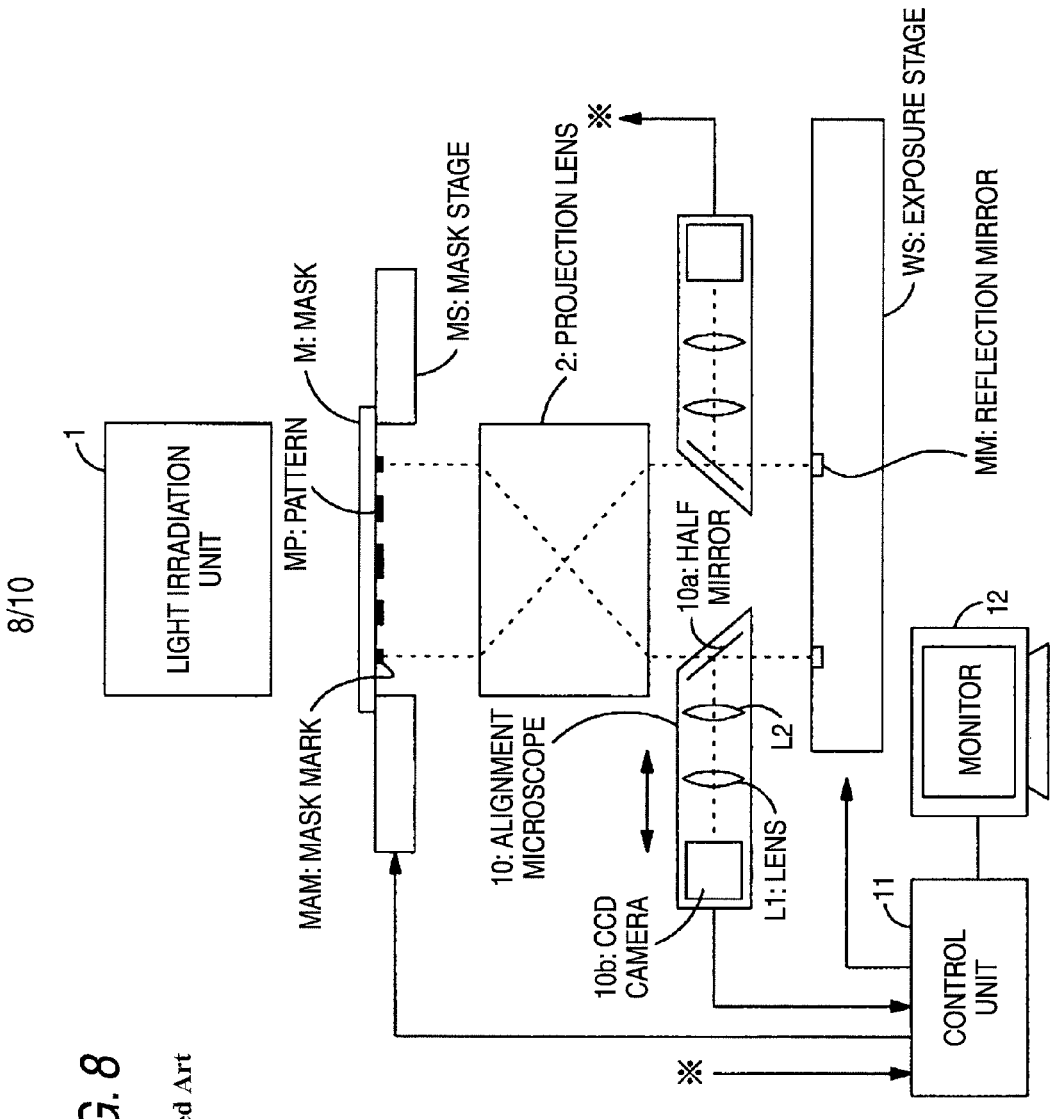
FIG. 8 is a diagram (#1) illustrating an example of a configuration of the related-art exposure device for sequentially performing exposure of a workpiece.
Figure 9:
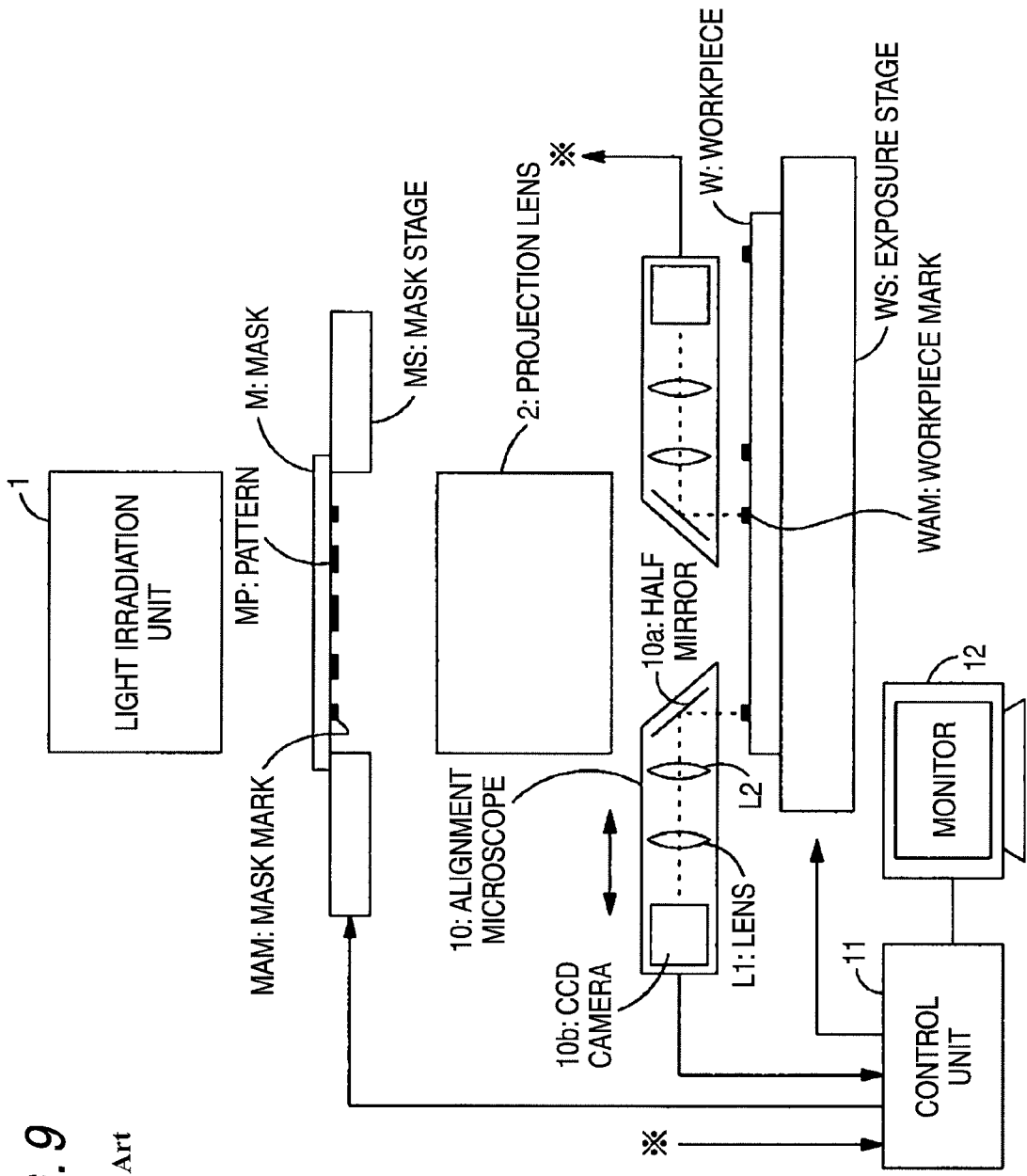
FIG. 9 is a diagram (#2) illustrating an example of a configuration of the related-art exposure device for sequentially performing exposure of a workpiece.
Figure 10:
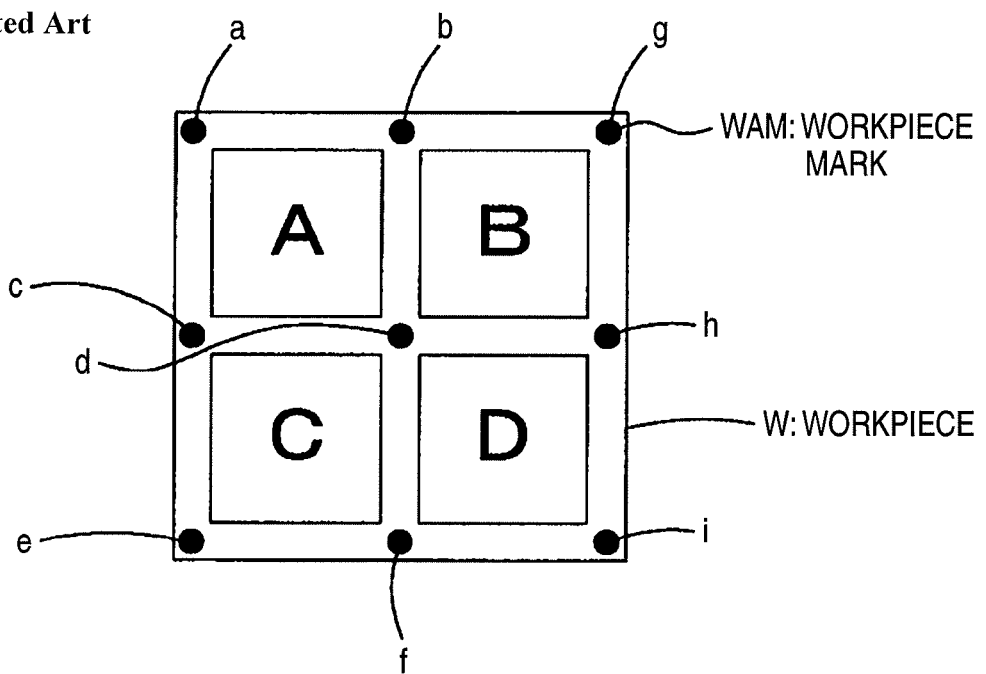
FIG. 10 is a diagram illustrating an example of a workpiece having four divided exposure areas.

The same reference numerals and signs are attached to parts having the same configuration as those of the related-art exposure device shown in FIG. 8. The exposure device includes a light irradiation unit 1, a mask M, a mask stage MS for holding the mask, a projection lens 2, an exposure stage WS for performing an exposure process on a workpiece W placed thereon while sequentially moving, an alignment microscope 10 for detecting a mask mark, and a control unit 11 for controlling an operation of the whole exposure device. Also, the operations of these elements are the same as those described above. Although not shown in FIG. 1, the alignment microscope 10 includes a half mirror 10a, lenses L1 and L2, and a CCD camera 10b as shown in FIG. 8.

In the exemplary embodiment, as shown in FIG. 1, in addition to the exposure processing unit 21 including the exposure stage WS, an alignment stage unit 22 is newly provided. The alignment unit 22 includes an alignment stage AS and is used to detect a position of the workpiece mark.

The alignment stage unit 22 is provided with the alignment stage AS for placing the workpiece W having the workpiece mark WAM formed thereon, and an alignment microscope 4 for detecting the workpiece mark WAM.

In addition, an alignment stage moving mechanism 22a is provided which relatively moves the alignment stage AS and the alignment microscope 4 in the 1-axis direction by the width of the workpiece. FIG. 1 shows the alignment stage moving mechanism 22a for moving the alignment stage AS, but does not show a mechanism for moving the alignment microscope 4.

A workpiece transporting mechanism 23 for transporting the workpiece W from the alignment stage AS to the exposure processing unit 21 is provided between the alignment stage unit 22 and the exposure processing unit 21. The workpiece transporting mechanism 23 transports the workpiece from the alignment stage unit 22 to the exposure processing unit 21 with high precision such that the positional coordinates (positional relationship between the workpiece W and the stage AS) of the workpiece marks WAM detected and stored in the alignment stage unit 22 coincide (deviation does not occur) with the positional coordinates of the workpiece marks WAM (positional relationship between the workpiece W and the stage WS) in the exposure processing unit 21.

That is, the workpiece W is transported from the alignment stage unit 22 to the exposure processing unit 21 such that the relationship of the positional coordinates of the workpiece marks WAM with respect to the alignment stage AS detected in the alignment stage unit 22 can be maintained in the exposure stage 21. In other words, the workpiece W is transported such that the positional coordinates of the workpiece marks WAM with respect to the stage WS in the exposure processing unit 21 coincide with the positional coordinates of the workpiece marks WAM with respect to the stage AS in the alignment stage unit 22.

In order to transport the workpiece such that the positional coordinates of the workpiece marks WAM detected in the alignment stage unit 22 coincide with the positional coordinates of the workpiece marks WAM in the exposure processing unit 21, it is conceivable to use any configuration that can align the workpiece at a given position with high precision as the transporting mechanism 23. For example, the following configuration may be used.

That is, the alignment stage AS and the exposure stage WS are configured to be separated into upper and lower portions, the upper portion is formed of a workpiece holding member 3, and a positioning means is provided which mechanically positions the workpiece holding member 3 by fitting or the like at a given position of an alignment stage body AS1 and an exposure stage body WS1.

The workpiece holding member 3 is provided with means for fixing and holding the workpiece such as a vacuum absorption means, and the workpiece holding member 3 is moved from the alignment stage unit 22 to the exposure processing unit 21 while the workpiece is absorbed by the vacuum absorption means.

At this time, the positioning is performed so that the workpiece holding member 3 is in a given relationship with the stage body on the alignment stage body AS1 and the exposure stage body WS1 by the positioning means.

With such a configuration, even in a case of handling a workpiece which is easily deformed to expand, contract, and warp, it is possible to move the workpiece W from the alignment stage unit 22 to the exposure processing unit 21 with good positional reproducibility.

Figure 2:
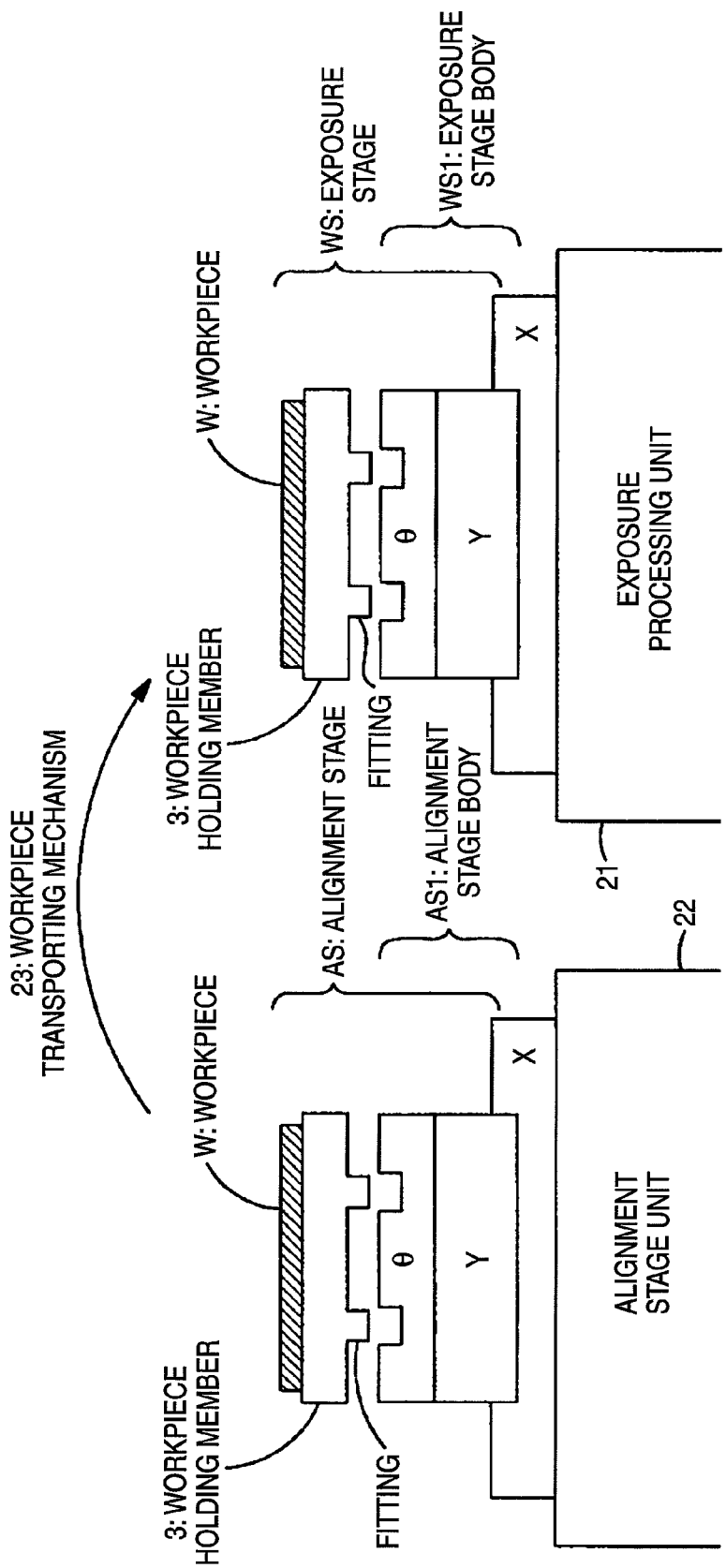
FIG. 2 is a diagram illustrating an example of a transport method using a positioning means for carrying out fitting with high precision so as not to cause a positional deviation.

FIG. 2 is a diagram illustrating an example of a transport method using a positioning means to carry out fitting with high precision so as not to cause a positional deviation.

As shown in FIG. 2, the alignment stage AS and the exposure stage WS are configured to be separated into upper and lower portions, the upper portion is the workpiece holding member 3 for absorbing the workpiece with a vacuum, and the lower portion is the alignment stage body AS1 and the exposure stage body WS1. Convex and concave portions are formed in the upper and lower portions, respectively, and thus the upper and lower portions are fitted with each other.

The workpiece holding member 3 on which the workpiece W is mounted is placed on the alignment stage body AS1, and the position of the workpiece mark WAM is detected and stored in the alignment stage unit 22.

The workpiece transporting mechanism 23 transports both of the workpiece W and workpiece holding member 3 to the exposure processing unit 21 with the workpiece W held by the workpiece holding member 3, and the workpiece holding member 3 is fitted to the exposure stage body WS1.

The positional relationship of the workpiece holding member 3, the alignment stage body AS1, and the exposure stage WS1 is not changed, and thus the positional coordinates of the workpiece marks WAM stored in the alignment stage unit 22 coincide with the positional coordinates of the exposure stage body WS1 of the exposure processing unit 21. In other words, it is possible to transport the workpiece W such that the position (Xn, Ym) of the workpiece mark detected in the alignment stage AS is the position (Xn, Ym) of the exposure stage WS as it is.

Figure 3:
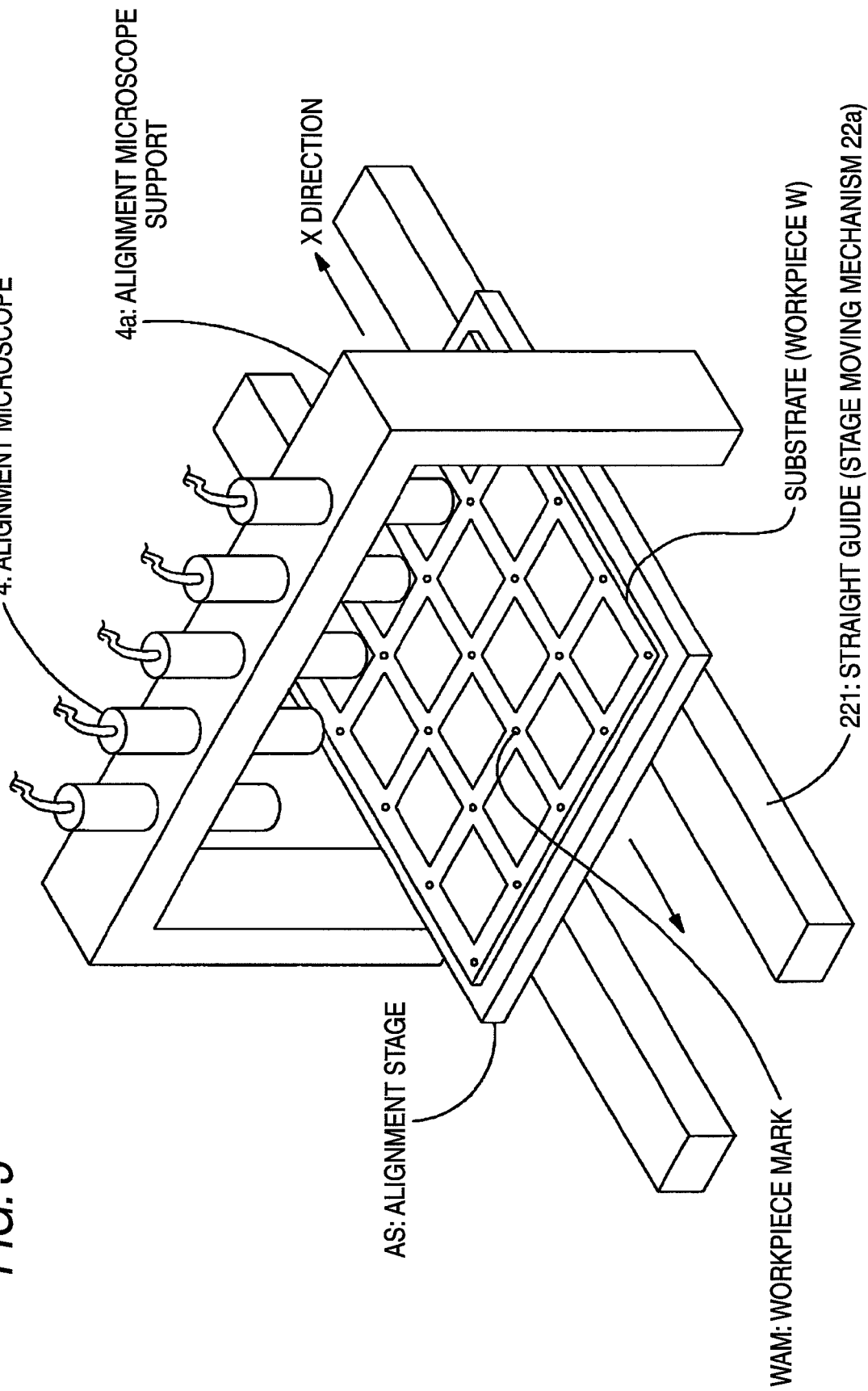
FIG. 3 is a perspective view illustrating a configuration of an alignment stage unit according to the exemplary embodiment of the invention.
Figure 4:
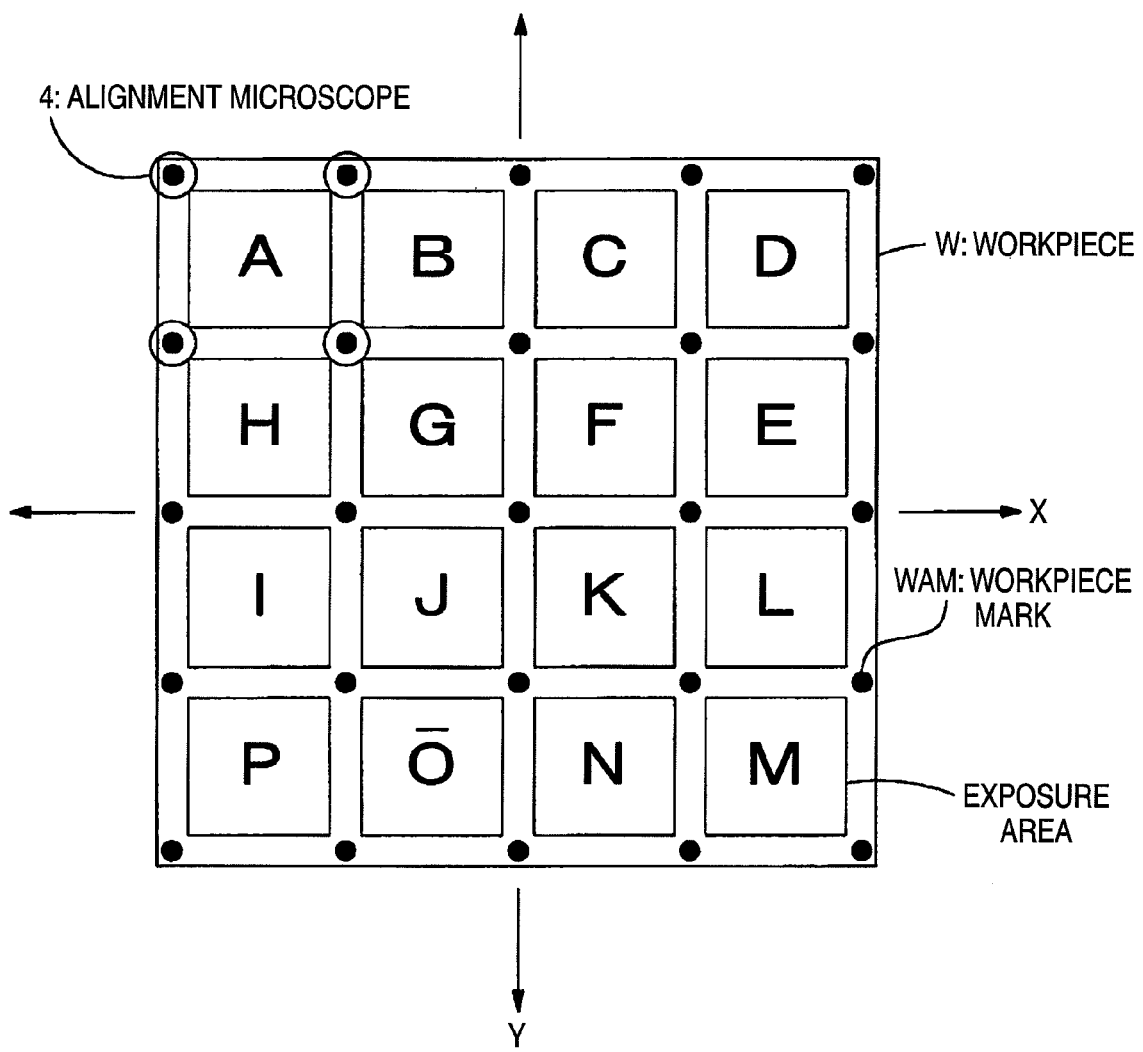
FIG. 4 is a diagram illustrating an example of exposure areas of a workpiece.

FIG. 3 is a perspective view illustrating a configuration of the alignment stage unit 22 of the exposure device according to the exemplary embodiment of the invention, and FIG. 4 is a diagram illustrating an example of the exposure area of the workpiece W.

As shown in FIG. 3, the alignment stage unit 22 is provided with the alignment stage AS for placing the workpiece W having the workpiece marks WAM formed thereon. The stage AS includes the workpiece holding member 3 provided with the vacuum absorption mechanism for absorbing and holding the workpiece W, and the stage body AS1, but these elements are omitted in FIG. 3. The alignment stage AS is provided with the Yθ moving mechanism for adjusting the position of the workpiece so that the workpiece mark WAM of the placed workpiece W can be seen by the alignment microscope 4, but this element is also omitted herein.

The alignment stage AS is provided with a straight guide 221 as the stage moving mechanism 22a, and the alignment stage AS is moved only in the 1-axis direction (X direction), which is indicated by the arrow in the figure.

A plurality of alignment microscopes 4 for detecting the workpiece marks WAM are provided above the alignment stage AS. The alignment microscopes 4 are supported by a U-shaped alignment microscope support 4a.

The stage AS on which the workpiece W is mounted is moved under the U-shaped alignment microscope support 4a in one direction (X direction) by the straight guide 221.

The number of the alignment microscopes 4 corresponds to the number of the workpiece alignment marks WAM formed in a direction perpendicular to the movement direction of the stage AS in the workpiece W placed on the stage AS. In FIG. 3, for example, five alignment microscopes 4 are provided to fully detect the workpiece marks WAM shown in FIG. 4.

Figure 5:
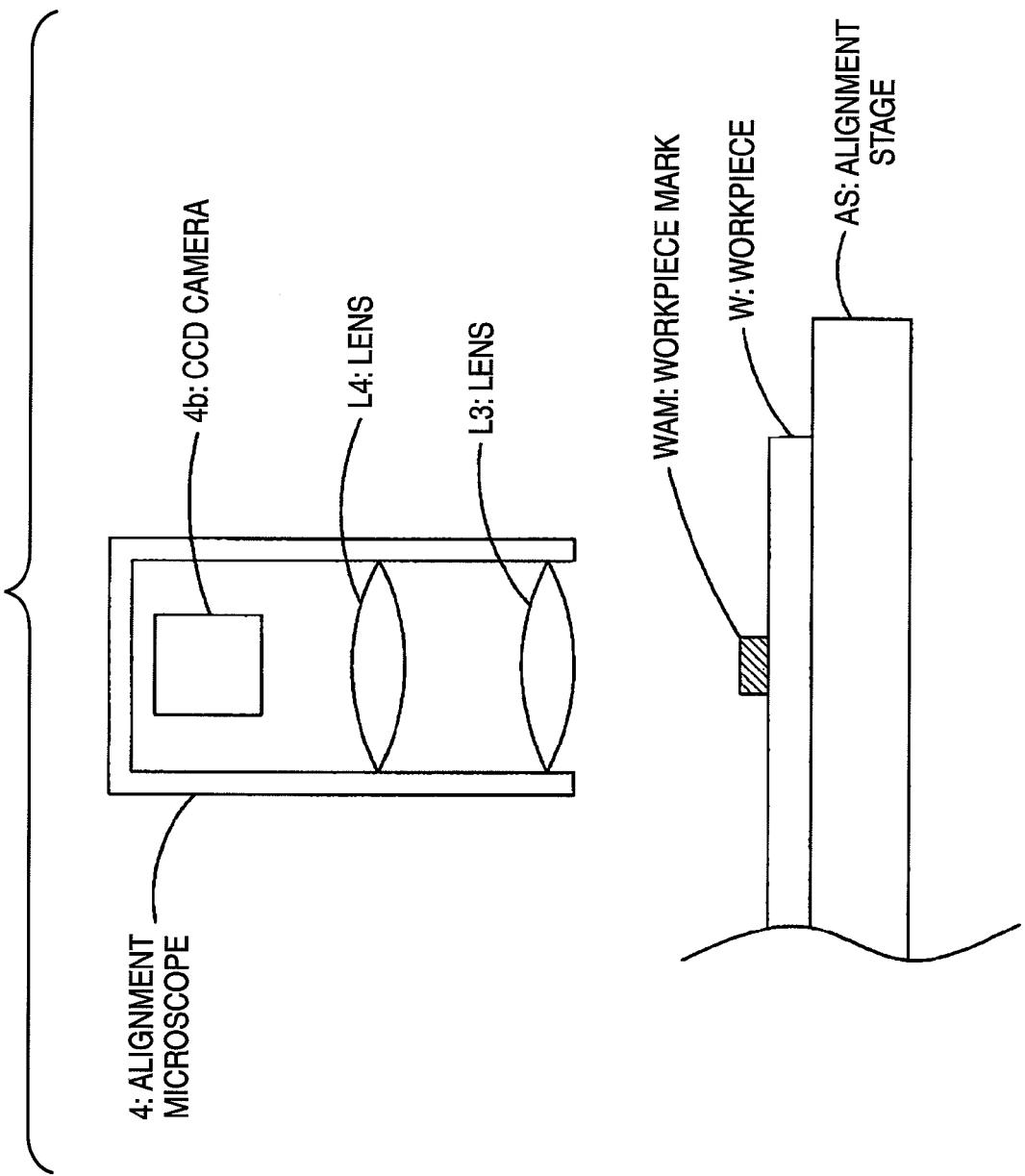
FIG. 5 is a diagram illustrating an example of a configuration of an alignment microscope for workpiece mark detection.

As shown in FIG. 5, the alignment microscope 4 includes lenses L3 and L4, and a CCD camera 4b. An image of workpiece mark received by the CCD camera 4b is transmitted to the control unit 11 and then is processed. Then, the positional coordinates are calculated and stored.

The sequence of the exposure process will be now described with reference to FIG. 1, FIG. 3, and FIG. 4. The workpiece transporting mechanism 23 that transports the workpiece from the alignment stage AS of the alignment stage unit 22 to the exposure stage WS can transport the workpiece such that the positional coordinates of the alignment stage AS coincide with the positional coordinates of the exposure stage WS as described above.

The mask M is irradiated with exposure light from the light irradiation unit 1 in a state where the exposure stage WS of the exposure processing unit 21 is not loaded with the workpiece W.

The mask marks MAM formed on the mask M are projected onto the reflection mirror MM of the exposure stage WS. The alignment microscopes 10 for mask mark detection are inserted between the projection lens 2 and the exposure stage WS. The projecting image of the mask mark MAM reflected by the reflection mirror MM is reflected by the half mirror 10a of the alignment microscope 10, and is input to the CCD camera 10b. The image of the mask mark MAM projected to the CCD camera 10b is transmitted to the control unit 11 and is processed, and then the positional coordinates (e.g., (Xm,Ym)) thereof are calculated and stored. The above description is the same as that described in the related art.

In addition, the alignment microscope 10 may be embedded in the exposure stage WS at the position of providing the reflection mirror MM.

Meanwhile, the workpiece W is placed on the alignment stage AS of the alignment stage unit 22. The alignment stage AS is moved stepwise at intervals of forming the workpiece marks WAM along the straight guide 221 of the stage moving mechanism 22a. The intervals of the workpiece marks WAM are stored beforehand in the control unit 11. The straight guide 221 of the stage moving mechanism 22a has a good direct movement property.

The alignment microscopes 4 detect the alignment marks WAM arranged in the direction perpendicular to the movement direction in a line. When the detection of the line of the alignment marks WAM is completed, the alignment stage AS is moved stepwise at the intervals of forming the workpiece marks WAM and the next line workpiece marks WAM are detected.

Every time the workpiece W is fed stepwise, the images of the detected workpiece marks are transported to the control unit 11 and are processed, and then the positional coordinates thereof are calculated and stored.

When the coordinates of all the workpiece marks WAM are calculated, the workpiece transporting mechanism 23 transports the workpiece W from the alignment stage AS of the alignment stage unit 22 to the exposure stage WS of the exposure processing unit 21. As described above, the transporting mechanism 23 transports the workpiece such that the detected positional coordinates in the alignment stage AS coincide with the positional coordinates of the exposure stage WS (or they are in a given positional relationship).

In addition, as described above, the workpiece W may be transported to the exposure stage WS while the workpiece W is held by the workpiece holding member 3.

When the workpiece W is placed on the exposure stage WS, the exposure stage WS is moved in X, Y, and θ directions such that the positions of the four mask marks MAM stored in the control unit 11 coincide with the positions of the four workpiece marks of the first exposure area (or they are in a given relationship). Exposure light is irradiated from the light irradiation unit 1, the mask pattern is projected onto the workpiece W by the projection lens 2, and the first exposure area is exposed (transferred) with light.

When the exposure of the first exposure area is completed, the exposure stage WS is moved in the X and Y directions to perform the exposure of the second exposure area. When the second exposure area is under the projection lens, the exposure stage WS is moved such that the stored positions of the (four) mask marks coincide with the positions of the (four) workpiece marks WAM of the second exposure area (or they are in a given relationship), and the second exposure area is exposed with light.

Then, this process is repeatedly performed, and the sixteen divided exposure areas is exposed as shown in FIG. 4.

Figure 6:
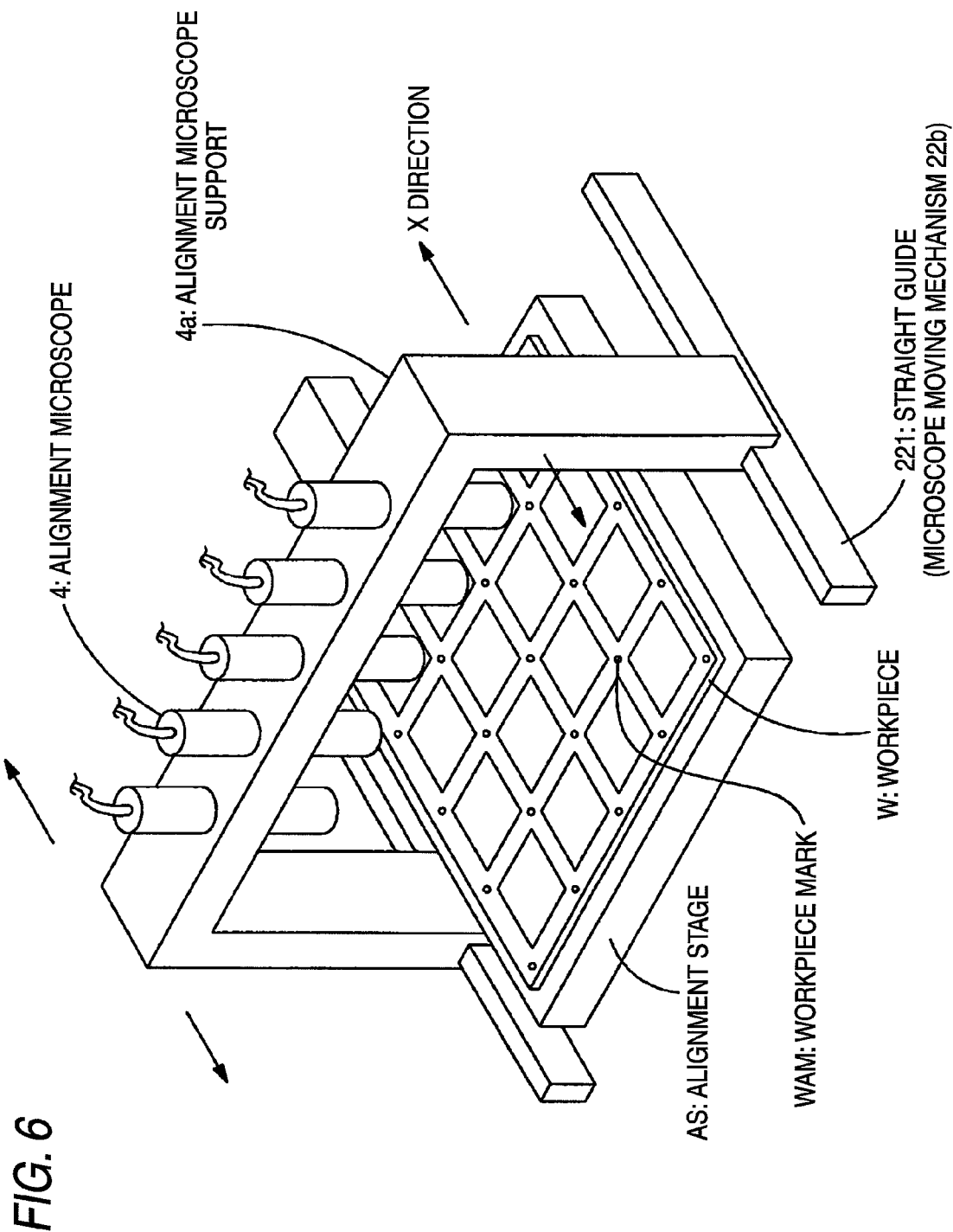
FIG. 6 is a diagram illustrating an alignment stage unit according to a second exemplary embodiment.

FIG. 6 is a diagram illustrating an alignment stage unit 22 according to a second exemplary embodiment.

In the first embodiment shown in FIG. 3, the alignment stage AS is moved relatively to the alignment microscopes 4 by the stage moving mechanism 22a. In the present embodiment, the alignment microscopes 4 are moved relatively to the alignment stage AS by a microscope moving mechanism 22b. That is, the straight guide 221 is attached to the alignment microscope support 4a, and thus the alignment microscopes 4 are moved in the 1-axis direction (X direction) by the width of the workpiece.

The alignment microscopes 4 detect the workpiece marks WAM arranged in the direction perpendicular to the movement direction in a line. When the detection of the line of the workpiece marks WAM is completed, the alignment microscope support 4a is moved stepwise at the intervals between the workpiece marks and the next line workpiece marks are detected.

In the alignment stage unit 22 according to the first and second exemplary embodiments, the workpiece is moved only in the 1-axis direction (X direction) by the width thereof, and it is possible to reduce the size of the alignment stage unit 22.

The number of the alignment microscopes 4 corresponds only to the number of the workpiece marks WAM arranged in the direction perpendicular to the movement direction of the alignment stage AS or the alignment microscopes 4, and thus it is possible to reduce the number of the alignment microscopes 4 and to reduce the cost of the whole exposure device.

Figure 7:
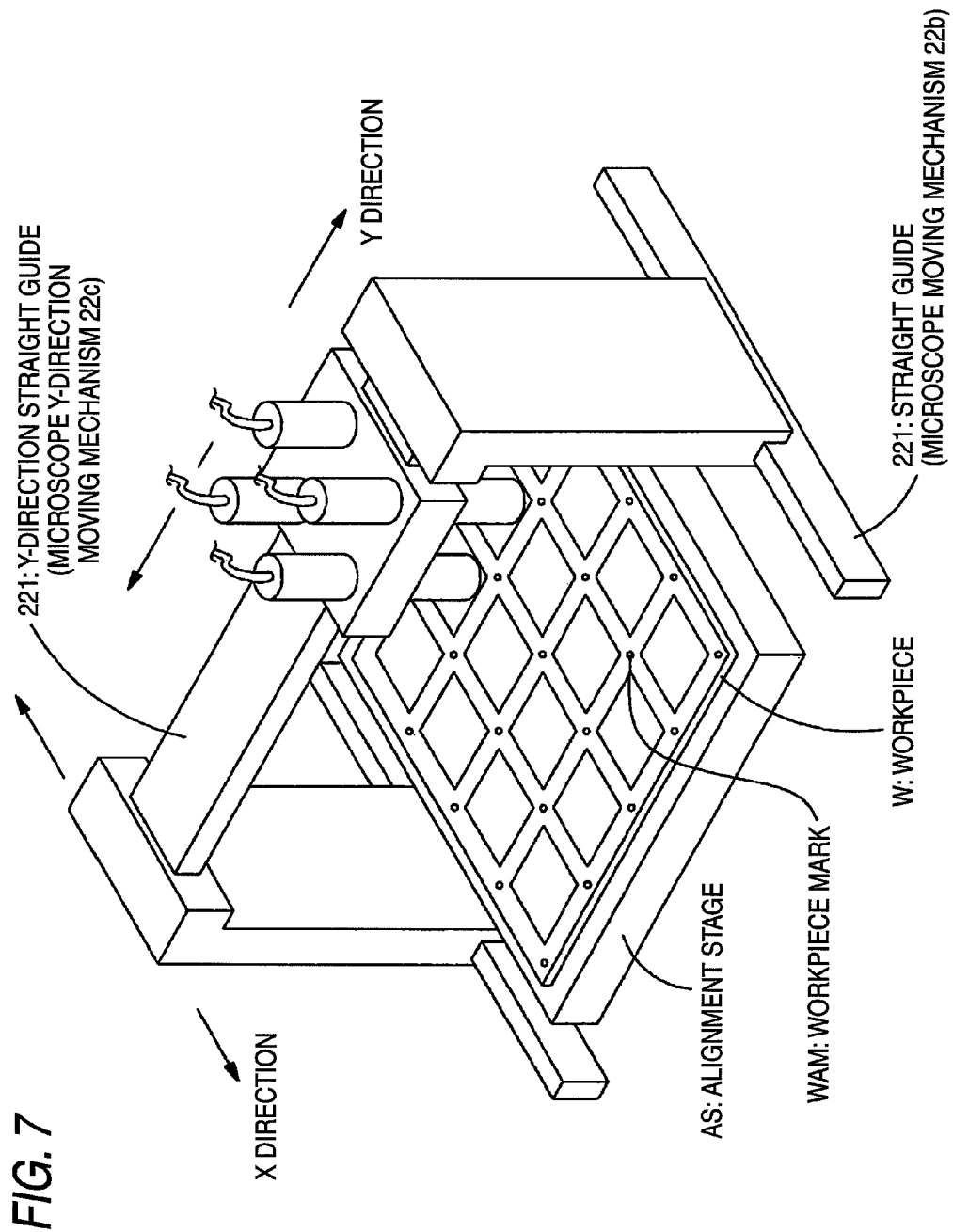
FIG. 7 is a diagram illustrating an alignment stage unit according to a third exemplary embodiment.

FIG. 7 is a diagram illustrating an alignment stage unit 22 according to a third exemplary embodiment.

In the third exemplary embodiment, a second microscope moving mechanism 22c is provided which moves a plurality of alignment microscopes 4 in a direction perpendicular to a relative movement direction of the alignment stage AS and the alignment microscopes 4.

With such a configuration, while the alignment microscopes 4 are repeatedly moved stepwise in the X and Y direction, the workpiece marks WAM are detected and stored.

In the present embodiment, it is necessary to provide a mechanism for moving the alignment microscopes 4 in the direction (Y direction) perpendicular to the relative movement direction of the stage AS and the microscopes 4 as compared with the first and second exemplary embodiments. Also, since the alignment stage AS is not moved in the Y direction, the size of the alignment stage unit 22 is basically the same as those of the first and second exemplary embodiments. In addition, the alignment microscopes 4 are also moved in the Y direction, and thus it is possible to reduce the number of the alignment microscopes 4.

Since the number of the alignment microscopes 4 is decreased and the alignment microscopes 4 are moved in the Y direction, the time necessary for detection of the workpiece marks WAM in one workpiece is extended as compared with the first and second exemplary embodiments. However, if the time is shorter than the exposure process time per workpiece in the exposure processing unit 21, there is no problem.

In FIG. 7, the moving mechanism for relatively moving the alignment stage AS and the alignment microscopes 4 by the width of the workpiece is provided close to the microscopes as in the second exemplary embodiment, but the moving mechanism may be provided close to the stage as in the first exemplary embodiment.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. An exposure device comprising:
    an alignment stage unit comprising:
        an alignment stage that holds a workpiece having workpiece marks thereon;
        at least one first alignment microscope that detects the workpiece marks of the workpiece; and
        a first moving mechanism that relatively moves the alignment stage and the first alignment microscope in only a 1-axis direction by a width of the workpiece;
    an exposure processing unit comprising:
        a mask stage that holds a mask having mask marks thereon;
        a second aligmnent microscope that detects the mask marks of the mask; and
        an exposure stage that holds the workpiece; and
    a workpiece moving mechanism that moves the workpiece from the alignment stage unit to the exposure processing unit,
    wherein the workpiece marks and the mask marks are aligned with each other so as to be in a given positional relationship, and then the workpiece is irradiated with exposure light through the mask, and
    wherein the alignment stage unit further comprises:
        a second moving mechanism that moves the first alignment microscope in a direction perpendicular to the 1-axis direction.

2. The exposure device according to claim 1, wherein the workpiece moving mechanism comprises:
    a workpiece holding member that holds the workpiece; and
    a positioning means that is provided on the workpiece to mechanically position the workpiece holding member by fitting at a given position of the alignment stage and the exposure stage.

3. An exposure device comprising:
    an alignment stage unit comprising:
        an alignment stage that holds a workpiece having workpiece marks thereon;
        at least one first alignment microscope that detects the workpiece marks of the workpiece; and
        a first moving mechanism that relatively moves the alignment stage and the first alignment microscope in only a 1-axis direction by a width of the workpiece;
    an exposure processing unit comprising:
        a mask stage that holds a mask having mask marks thereon;
        a second alignment microscope that detects the mask marks of the mask; and
        an exposure stage that holds the workpiece; and
    a workpiece moving mechanism that moves the workpiece from the alignment stage unit to the exposure processing unit,
    wherein the workpiece marks and the mask marks are aligned with each other so as to be in a given positional relationship, and then the workpiece is irradiated with exposure light through the mask, and
    wherein the number of the at least one first alignment microscope corresponds to the number of the workpiece marks arranged in a direction perpendicular to the 1-axis direction.

4. The exposure device according to claim 3, wherein the workpiece moving mechanism comprises:
    a workpiece holding member that holds the workpiece; and
    a positioning means that is provided on the workpiece to mechanically position the workpiece holding member by fitting at a given position of the alignment stage and the exposure stage.

* * * * *